(12) United States Patent  (10) Patent No.: US 8,796,852 B2
Zhu  (45) Date of Patent: Aug. 5, 2014

(54) 3D INTEGRATED CIRCUIT STRUCTURE AND METHOD FOR MANUFACTURING THE SAME

(75) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 203 days.

(21) Appl. No.: 13/380,022

(22) PCT Filed: Feb. 22, 2011

(86) PCT No.: PCT/CN2011/071166
§ 371 (c)(1),
(2), (4) Date: Dec. 21, 2011

(87) PCT Pub. No.: WO2012/041034
PCT Pub. Date: Apr. 5, 2012

(65) Prior Publication Data
US 2012/0193797 A1  Aug. 2, 2012

(30) Foreign Application Priority Data
Sep. 30, 2010  (CN) .......................... 2010 1 0502039

(51) Int. Cl.
*H01L 23/48* (2006.01)
*H01L 21/768* (2006.01)
*H01L 25/065* (2006.01)
*H01L 23/00* (2006.01)

(52) U.S. Cl.
CPC . *H01L 21/76898* (2013.01); *H01L 2224/05009* (2013.01); *H01L 2225/06513* (2013.01); *H01L 24/13* (2013.01); *H01L 2225/06541* (2013.01); *H01L 2924/13091* (2013.01); *H01L 2224/13009* (2013.01); *H01L 25/0657* (2013.01); *H01L 23/481* (2013.01)

USPC .......... 257/751; 257/532; 257/768; 257/769; 257/774; 257/E21.008; 257/E21.586; 257/E23.011; 438/667; 438/675

(58) Field of Classification Search
USPC .......... 257/532, 751, 768, 769, 774, E21.008, 257/E21.586, E23.011; 438/667, 675
See application file for complete search history.

(56) References Cited

U.S. PATENT DOCUMENTS

| 2010/0164062 | A1 | 7/2010 | Wang et al. | |
| 2010/0193954 | A1* | 8/2010 | Liu et al. ....................... | 257/751 |
| 2012/0168935 | A1* | 7/2012 | Huang .......................... | 257/737 |
| 2013/0200525 | A1* | 8/2013 | Lee et al. ..................... | 257/774 |

FOREIGN PATENT DOCUMENTS

CN  101814475 A  8/2010

OTHER PUBLICATIONS

PCT Int'l Search Report.
PCT Written Opinion, Jul. 7, 2011.

* cited by examiner

*Primary Examiner* — Dao H Nguyen
(74) *Attorney, Agent, or Firm* — Goodwin Procter LLP (57) ABSTRACT

A 3D integrated circuit structure comprises a first chip, wherein the first chip comprises: a substrate; a semiconductor device formed on the substrate and a dielectric layer formed on both the substrate and the semiconductor device; a conductive material layer formed within a through hole penetrating through both the substrate and the dielectric layer; a stress releasing layer surrounding the through hole; and a first interconnecting structure connecting the conductive material layer with the semiconductor device. By forming a stress releasing layer to partially release the stress caused by the conductive material in the via, the stress caused by mismatch of CTE between the conductive material and the semiconductor (for example, silicon) surrounding it can be reduced, thereby enhancing the performance of the semiconductor device and the corresponding 3D integrated circuit consisting of the semiconductor devices.

13 Claims, 7 Drawing Sheets

3D INTEGRATED CIRCUIT STRUCTURE AND METHOD FOR MANUFACTURING THE SAME

CROSS REFERENCE TO RELATED APPLICATIONS

The present application is a National Phase application of, and claims priority to, PCT Application No. PCT/CN2011/071166 filed on Feb. 22, 2011, entitled "3D INTEGRATED CIRCUIT STRUCTURE AND METHOD FOR MANUFACTURING THE SAME," which claimed the priority of Chinese Patent Application No. 201010502039.5, and filed on Sep. 30, 2010. Both the PCT application and the Chinese application are incorporated herein by reference in their entireties.

FIELD OF THE INVENTION

The present invention is generally related to semiconductor manufacturing technology, and particularly to a 3D integrated circuit structure and a method for manufacturing the same.

BACKGROUND OF THE INVENTION

A 3D integrated circuit (IC) in the prior art is described as a system-level architecture which comprises a plurality of chips, and each chip comprises a stack structure of a plurality of planar device layers. These chips are interconnected by at least one through-silicon via (TSV) in the Z direction. With the application of 3D technology, TSVs will be scaled down in sizes, the silicon layer will become thinner continuously, and 3D integrated circuits will be applied more extensively.

In some processes for manufacturing 3D integrated circuits, for example, in the process for forming TSVs, conductive materials, such as copper, aluminum, wolfram, or the like, are filled to form TSVs, which will bring about severe thermal-mechanical stress, thereby leading to cracks in the TSVs and in the semiconductor structures surrounding the TSVs, and causing device failure due to variation of current, and the like.

SUMMARY OF THE INVENTION

One object of the present invention is to provide a method to solve at least one of the problems in the prior art described above. To achieve the object, one embodiment of the present invention provides a 3D integrated circuit structure and a method for manufacturing the same, so as to improve the performance of 3D integrated circuits.

One embodiment of the present invention provides a 3D integrated circuit structure comprising a first chip, wherein the first chip comprises: a substrate; a semiconductor device formed on the substrate and a dielectric layer formed on both the substrate and the semiconductor device; a conductive material layer formed within a through hole penetrating through both the substrate and the dielectric layer; a stress releasing layer surrounding the through hole; and a first interconnecting structure connecting the conductive material layer with the semiconductor device.

Another embodiment of the present invention provides a method for manufacturing a 3D integrated circuit structure, comprising: A. providing a first chip, wherein the first chip comprises a substrate, a semiconductor device and a dielectric layer, and wherein the semiconductor device is formed on the substrate, and the dielectric layer is formed on both the substrate and the semiconductor device; B. forming a through hole and a stress releasing layer, wherein the through hole penetrating through both the substrate and the dielectric layer, and the stress releasing layer surrounds the through hole; C. filling the through hole to form a conductive material layer; and D. forming a first interconnecting structure for connecting the semiconductor device with the conductive material layer.

According to the embodiments of the present invention, as for the semiconductor device formed on the dielectric layer, part of the stress caused by the mismatch of coefficient of thermal expansion (CTE) between the conductive material in the via and the semiconductor material (for example, silicon) surrounding the via can be released by forming a stress releasing layer in the via, thereby improving the performance of the MOSFET device and the corresponding 3D integrated circuit composed of the MOSFET device.

Some additional aspects and advantages of the present invention will be partly described in detail and will become explicit in the following description, or can be understood in the application of the embodiments of the present invention.

BRIEF DESCRIPTION OF THE DRAWINGS

The accompanying drawings, which are incorporated herein and form a part of the specification, and together with the description to the embodiments, further serve to explain the above-mentioned and other advantages and aspects of the embodiments of the present invention.

DETAILED DESCRIPTION OF THE EMBODIMENTS

Embodiments of the present invention will be described in detail as follows with reference to the accompanying drawings. The same or similar reference numbers are used to represent the same or similar devices or devices with the same or similar function throughout the drawings. The embodiments described with the accompanying drawings as follows are illustrative, and are used to describe the present invention rather than limit the scope of the present invention.

Different embodiments and examples are provided to manufacture different structures of the present invention. Components and configuration of certain embodiments are described for simplification of disclosure. Of course, they are only illustrative, and are not intended to limit the scope of the present invention. In addition, numbers and/or characters may be repeated in different embodiments of the present invention. Such repetition is for the purpose of simplification and clarity, rather than indication of relationship in examples and configuration of different embodiments that are discussed. Although examples of various techniques and/or materials are provided in the embodiments of the present invention, it occurs to those skilled in the art that other techniques and/or other materials may also be employed. In addition, the structure in which a first element is formed on a second element described below may comprise the embodiments in which the first element and second element are in direct contact, and may also comprise the embodiments in which other elements are formed between the first and the second elements such that the first element may be not in direct contact with the second element.

Embodiment 1

Figure 1A:
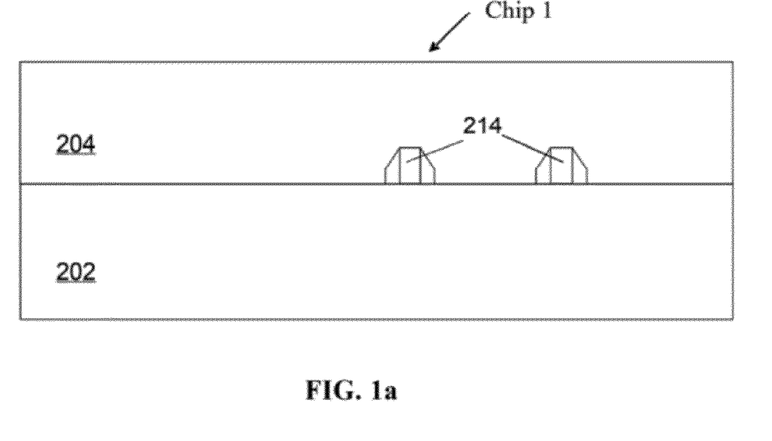
FIG. 1a and FIG. 1b show schematic cross-sectional views of intermediate structures in a method for manufacturing a 3D integrated circuit chip according to a first embodiment of the present invention.
Figure 1B:
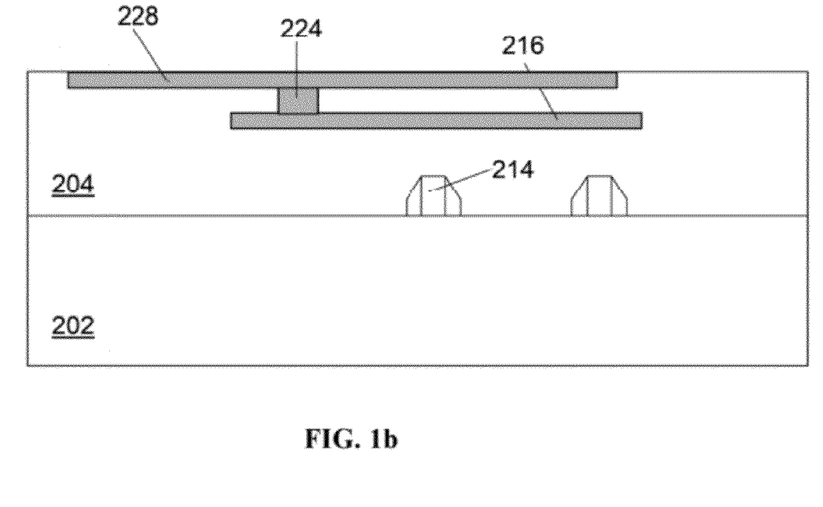

In one embodiment of the present invention, chips are bonded firstly, and then vias (for example, TSVs) are formed to manufacture a 3D integrated circuit. FIG. 1a and FIG. 1b show schematic cross-sectional views of intermediate structures in a method for manufacturing a 3D integrated circuit chip according to a first embodiment of the present invention.

Referring to FIG. 1a, a chip 1 comprises a substrate 202. In one embodiment of the present invention, the substrate 202 comprises a bulk silicon substrate. Accordingly, a via to be formed is a Through Silicon Via (TSV). In practical applications, the substrate may comprise any appropriate semiconductor material, such as, but not limited to, one or more materials selected from a group consisting of silicon, germanium, silicon germanium, silicon on insulator (SOI), silicon carbide and gallium arsenide, or any III/V compound semiconductor, or the like. According to design requirements of the prior art (for example, an n-type substrate or a p-type substrate), the substrate 202 may comprise various doping configurations. Furthermore, the substrate 202 may optionally comprise an epitaxial layer, or may be manipulated by stress to enhance performance. The chip 1 further comprises: a semiconductor device 214 formed on the substrate 202, and a dielectric layer 204 formed on both the substrate 202 and the semiconductor device 214. The dielectric layer 204 may be an oxide layer. For example, the dielectric layer 204 may be formed on the substrate 202 by a well-known deposition process in the art. The dielectric layer 204 may have a thickness within the range of about 100-300 nm. The chip structure in FIG. 1a is formed after the above-mentioned steps.

Referring to FIG. 1b, a Back-End-Of-Line (BEOL) structure 216, a via 224 and a metal interconnecting wire 228 of the via 224 on the BEOL structure 216 are formed on the chip shown in FIG. 1a. The BEOL structure 216 may be a copper interconnection formed by a metal wiring process. The semiconductor device 214 and the BEOL structure 216 are formed in the dielectric layer 204. The BEOL structure 216, the via 224 on the BEOL structure 216, and the metal interconnecting wire 228 of the via 224 may be formed by any appropriate process known in this art, which is not limited in the present invention.

Figure 2:
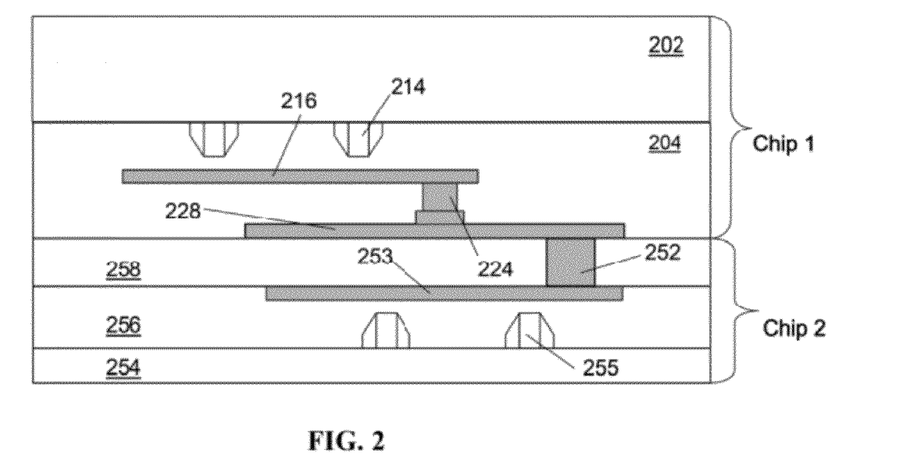
FIGS. 2-6 show schematic cross-sectional views of intermediate structures in a method for manufacturing a 3D integrated circuit structure by using the chips formed in the first embodiment shown in FIG. 1a and FIG. 1b.

Thereafter, referring to FIG. 2, a via 252 is formed on a chip 2. The via 252 is connected with a BEOL structure 253 of the semiconductor device 255 formed on the chip 2. The semiconductor device 255, the BEOL structure 253 and the via 252 of the chip 2 may be formed by the same method as that of the chip 1. Namely, the semiconductor device 255 is formed in the dielectric layer 256 on a SOI layer, the via 252 is formed in the dielectric layer 258 on the dielectric layer 256. Thereafter, the chip 1 is flipped over and bonded with the chip 2 by the metal interconnecting wire 228 to form the device structure shown in FIG. 2.

Figure 3:
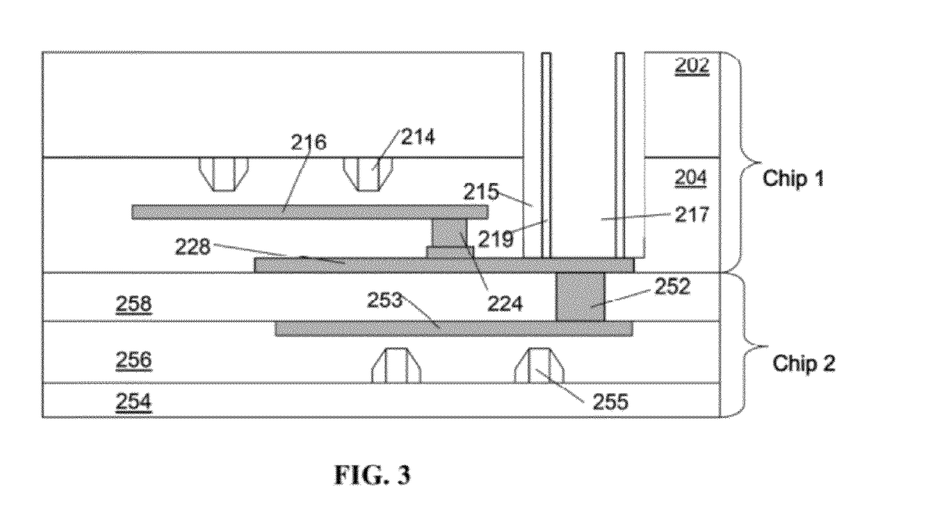

FIGS. 3-6 show schematic cross-sectional views of intermediate structures in a method for further forming a TSV in the device structure shown in FIG. 2. The method for forming the TSV comprises: firstly, forming a photoresist pattern which is corresponding to the patterns of both a through hole and a stress releasing passage to be formed; then, according to the photoresist pattern, etching the substrate 202 of the chip 1 and the dielectric layer 204 in which the semiconductor device 214 is formed, so as to form a through hole 217 with a stress passage isolating layer 219 as external sidewalls and form a stress releasing passage 215 surrounding the through hole 217, wherein the stress releasing passage 215 acts as a stress releasing layer as shown in FIG. 3. The stress releasing layer may be kept unfilled (only containing air), or be filled with soft materials, such as one selected from a group consisting of polymer, rubber and plastic, or combinations thereof. By employing the stress releasing layer, the mechanical stress caused by the conductive material can be released effectively when the through hole is subsequently filled with a conductive material, thereby reducing the impact of the mechanical stress on other parts of the chip.

Figure 4:
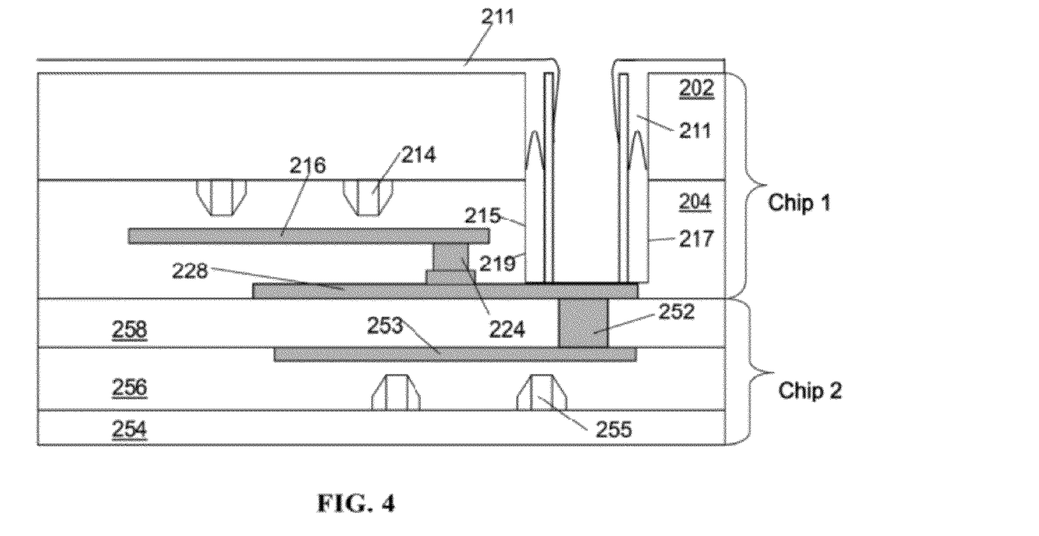

Afterwards, a dielectric layer may be preferably deposited on the device. The dielectric layer may be a nitride layer, and may be formed by a chemical vapor deposition process or other processes, as shown in FIG. 4. Thereafter, the nitride layer on the device is etched. For example, referring to FIG. 5, the nitride layer may be etched by a dry etching process or a wet etching process, and a thin nitride layer 211 is kept on the stress releasing passage 215. The stress releasing layer comprises the stress releasing passage 215 and the nitride layer 211. It should be noted that by covering the surface of the stress releasing passage 215 with a dielectric material layer (for example, a nitride layer 211), the stress releasing layer can be protected from being contaminated when the through hole is filled with conductive materials subsequently. However, this step is not indispensable.

Figure 5:
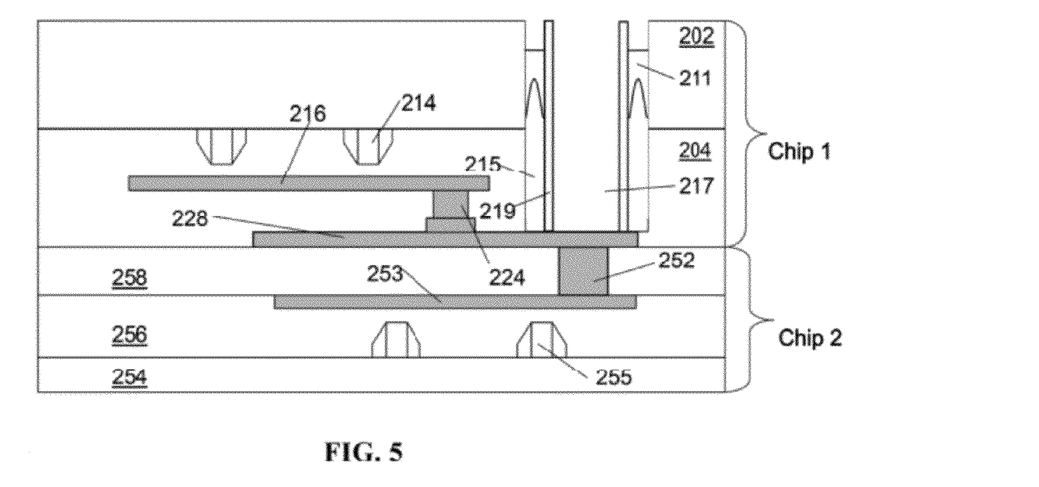

Thereafter, an insulating layer 218 is formed on sidewalls of the stress passage isolating layer 219. For example, isolating materials such as oxide or $Si_3N_4$ may be deposited into the through hole 217 to enhance the insulation performance of the through hole 217. Thereafter, a stop layer 220 may be deposited on the sidewalls of the insulating layer 218, so as to prevent metal conductive materials filled into the through hole 217 in subsequent process from moving outside to enter into the semiconductor device and further deteriorate the performance of a MOSFET 214. In one embodiment, the stop layer 220 may comprise a material selected from a group consisting of Ru, Ta, TaN, Ti, TiN, TaSiN, TiSiN, TiW and WN, or combinations thereof.

Figure 6:
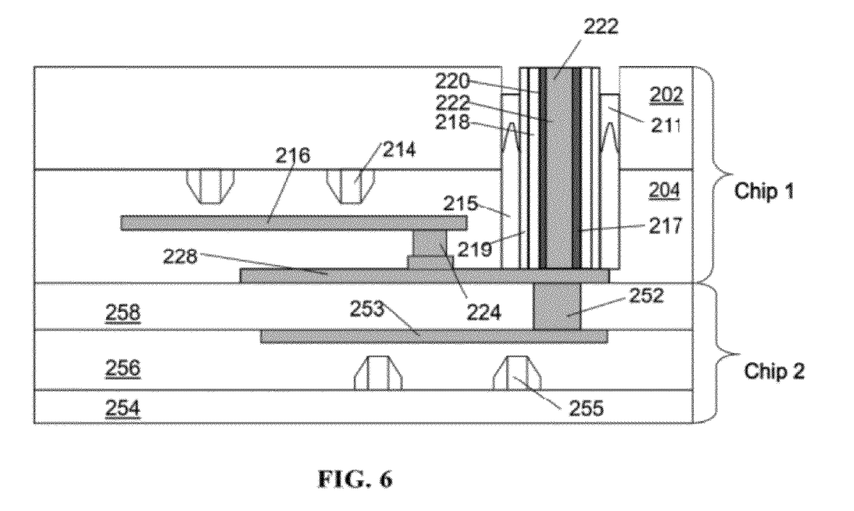

Finally, a conductive via 222 is formed by filling the through hole 217 with a conductive material, which may comprise metals such as at least one selected from a group consisting of Cu, Al, and W, or conductive polymer, metal silicide, and the like. Accordingly, the TSV shown in FIG. 6 is formed for interconnecting chips of 3D integrated circuits.

In other embodiments of the present invention, it should be noted that if the upper portion of the stress releasing passage 215 is not filled with the dielectric material layer, the stress releasing passage 215 should be protected by other methods, for example, using a patterned photoresist layer to cover the stress releasing passage 215, before filling the through hole 217 with conductive materials. In the embodiment of the present invention, the conductive via 222 may be made of metal materials. Then, the surface of the whole chip is planarized, for example, by a Chemical Mechanical Polishing (CMP) process, to form the TSV. The method for manufacturing the TSV may be any appropriate process in the prior art and is not limited by the present invention.

Embodiment 2

A method for firstly forming a via (for example, a TSV) and then bonding chips to form a 3D integrated circuit is provided in a second embodiment of the present invention. FIGS. 7a-7e show schematic cross-sectional views of intermediate structures in a method for manufacturing a 3D integrated circuit chip according to the second embodiment of the present invention.

Figure 7A:
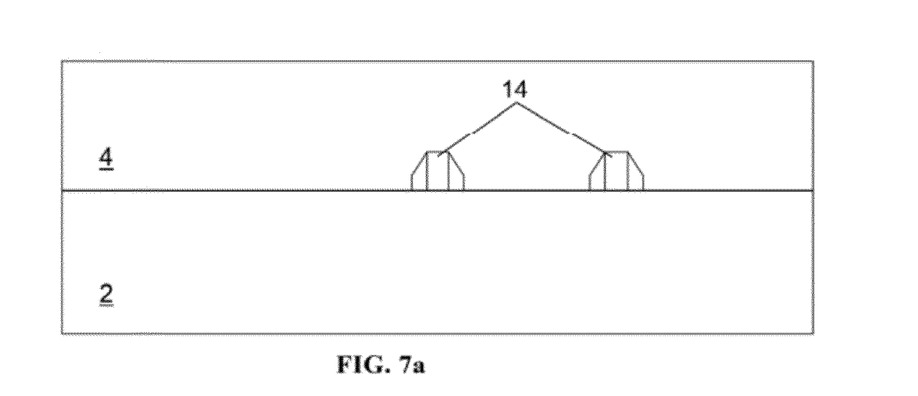
FIGS. 7a-7e show schematic cross-sectional views of intermediate structures in a method for manufacturing a 3D integrated circuit chip according to a second embodiment of the present invention.

Referring to FIG. 7a, the chip comprises a substrate 2. In the embodiment of the present invention, for example, the substrate 2 is made of bulk silicon. However, the material of the substrate 2 may refer to the material of the substrate 202 in the first embodiment. The chip further comprises: a semiconductor device 14 formed on the substrate 2, and a dielectric layer 4 formed on the substrate 2 and on the semiconductor device 14. The dielectric layer 4 may comprise an oxide layer. The oxide layer may be formed on the surface of the substrate 2 by any well-known deposition technique in the prior art, and may have a thickness of about 100 nm-300 nm. After above-mentioned steps, the chip structure shown in FIG. 7a is achieved.

Figure 7B:
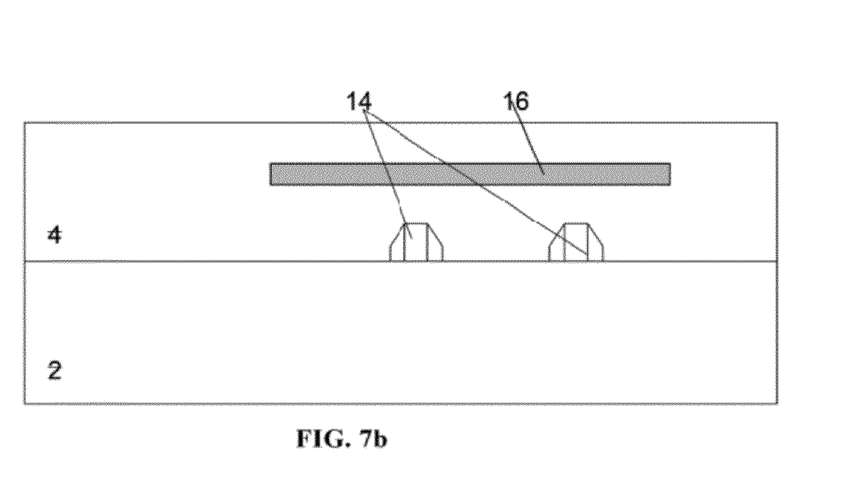

Referring to FIG. 7b, a metal-oxide-semiconductor (MOS) device 14 and a BEOL structure 16 of the MOS device 14 are formed on the chip structure shown in FIG. 7a. The BEOL structure 16 may be a copper interconnection formed by a metal wiring process. The semiconductor device 14 and the BEOL structure 16 of the semiconductor device 14 are formed in the dielectric layer 4. The semiconductor device 14 and the BEOL structure 16 of the semiconductor device 14 may be manufactured by any appropriate conventional method in the art.

Figure 7C:
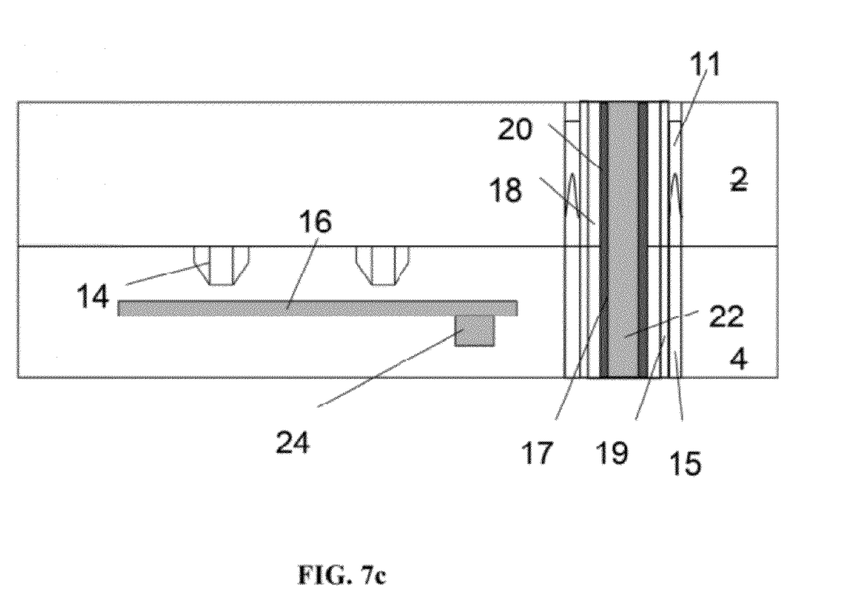
Figure 7D:
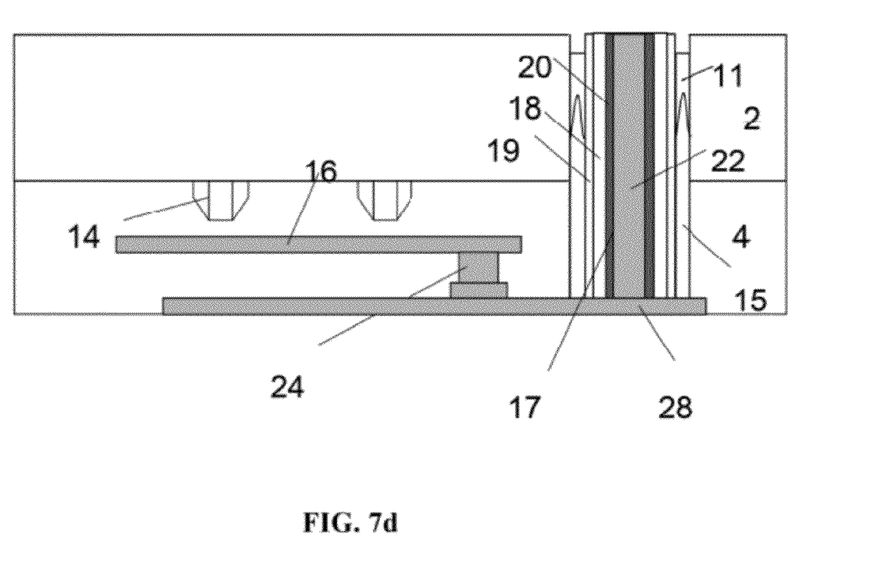
Figure 7E:
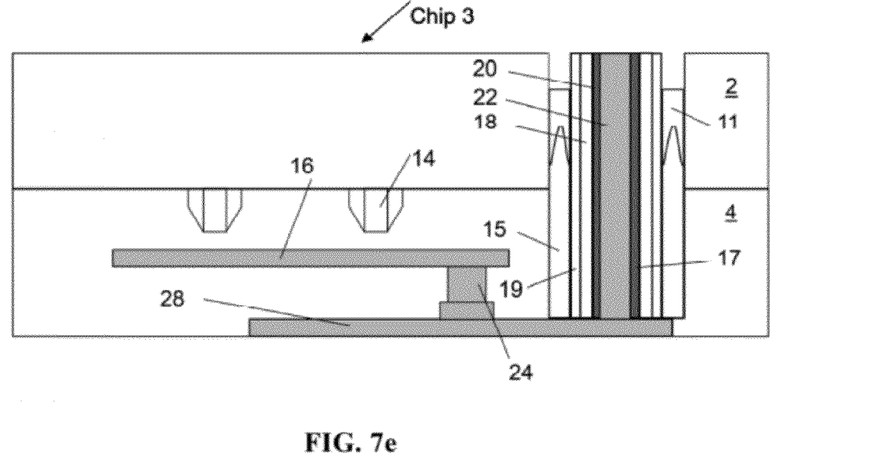

FIG. 7c shows a schematic cross-sectional view of further forming the TSV on the structure shown in FIG. 7b. Before the TSV is formed, the chip is flipped over so that the bottom surface of the chip is upturned. FIGS. 7c-7e show arrangements in which the chip is flipped over. The method for manufacturing the TSV comprises the following steps. Firstly, a through hole 17 with a stress passage isolating layer 19 as external sidewalls is formed by removing portions of the substrate 2 and the dielectric layer 4 in which the semiconductor device 14 is located, and a stress releasing layer comprising a stress releasing passage 15 is formed to surround the through hole 17. The stress releasing layer (namely, the stress releasing passage 15 in the present embodiment) may be kept unfilled (for example, containing air only), or be filled with any soft material, such as a soft material selected from a group consisting of polymers, rubbers and plastics, or combinations thereof. The method for forming the TSV in the present embodiment is the same as that of the first embodiment of the present invention, and is described briefly here. And similarly, the stress releasing passage 15 may be partially covered with a dielectric material layer for protection. Referring to FIG. 7c, the through hole 17 and the stress passage isolating layer 19 may be formed by lithography and etching. Thereafter, a dielectric layer such as a nitride layer is preferably deposited on the structure, for example, by a Chemical Vapor Deposition process, or the like. Then the nitride layer on the structure is etched and a thin nitride layer 11 is kept on the upper part of the stress releasing passage 15. The stress releasing layer comprises the stress releasing passage 15 and the nitride layer 11. Thereafter, an insulating layer 18 may be formed on the sidewalls of the stress passage isolation layer 19, for example, by depositing insulating materials such as oxide or nitride (for example, $Si_3N_4$) into the through hole 17. Thereafter, a stop layer 20 may be optionally deposited on the sidewalls of the insulating layer 18 so as to prevent conductive materials filled into the through hole 17 in the subsequent process from moving outside and entering into the semiconductor device and further deteriorating the performance of the semiconductor device. In the present embodiment, the stop layer 20 may comprise a material selected from a group consisting of Ru, Ta, TaN, Ti, TiN, TaSiN, TiSiN, TiW and WN, or combinations thereof.

Finally, a conductive via 22 is formed by filling the through hole 17 with a conductive material, which may comprise metal materials such as Cu, Al, W, or conductive polymer, or metal silicide, or the like. Accordingly, the TSV for interconnecting the chips of the 3D integrated circuit is formed. In the embodiment of the present invention, the conductive via 22 is made of a metal material. The TSV is formed by planarizing the surface of the chip such as by a CMP process. The TSV may be manufactured by any appropriate conventional process in the art, and thus is not limited by the present invention.

FIG. 7d shows a schematic cross-sectional view of an intermediate structure in which an interconnecting structure connects the MOS device 14 with the TSV. The interconnecting structure comprises a via 24 and a metal interconnecting wire 28. The via 24 is formed on the BEOL structure 16 corresponding to the MOS device 14, and the metal interconnecting wire 28 connects the via 24 and the TSV. Therefore, the TSV can be connected with the MOS device 14 by the interconnecting structure. Accordingly, a 3D integrated circuit structure may be achieved by connecting the interconnecting structure of the chip with the corresponding interconnecting structures of other chips.

In order to connect the chip in FIG. 7d with other chips to form the 3D integrated circuit, or to provide power supply for the 3D integrated circuit, the bottom surface of the TSV of the corresponding chip needs to be polished or to be thinned so that the metal material in the TSV is exposed to achieve conductive connection.

Referring to FIG. 7e, the bottom surface of the chip is polished or thinned so that the conductive via 22 in the TSV at the bottom of the chip is exposed.

A chip 3 used in the 3D integrated circuit as shown in FIG. 7e is achieved after the above-mentioned steps.

Figure 8:
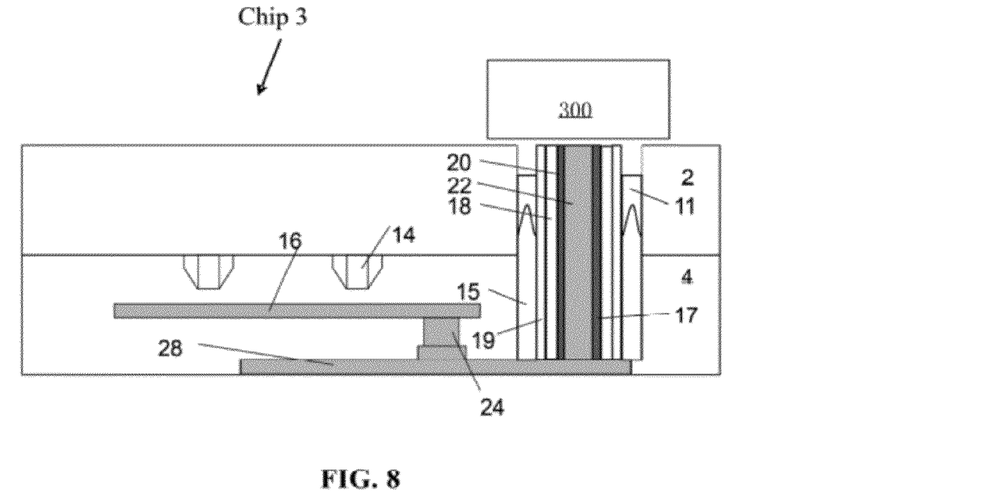
FIGS. 8-9 show schematic cross-sectional views of intermediate structures in a method for manufacturing a 3D integrated circuit structure by using the chips formed in the second embodiment shown in FIG. 7a-7e.
Figure 9:
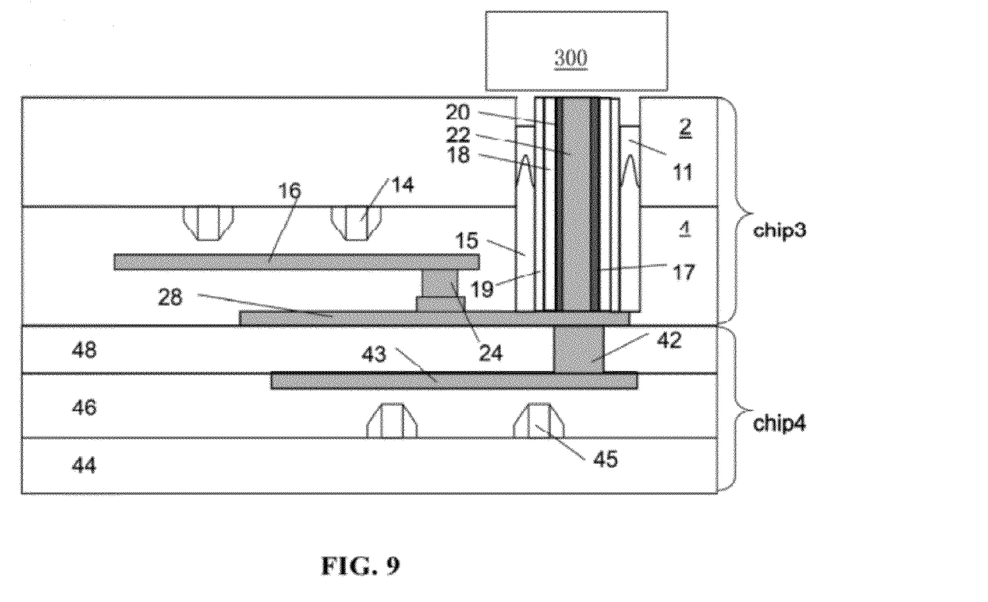

FIG. 8 and FIG. 9 show schematic cross-sectional views of intermediate structures in a method for manufacturing a 3D integrated circuit structure by using the chip 3 formed in the embodiment shown in FIGS. 7a-7e.

FIG. 8 shows a 3D integrated circuit structure formed according to an embodiment of the present invention. The 3D integrated circuit structure comprises a chip 3, and the chip 3 further comprises: a substrate 2; a semiconductor device 14 formed on the substrate, and a dielectric layer 4 formed on both the substrate 2 and the semiconductor device 14; a conductive material layer formed within a through hole 17 penetrating through the substrate 2 and the dielectric layer 4; a stress releasing layer surrounding the through hole 17; and a first interconnecting structure for connecting the semiconductor device 14 with the conductive material layer.

The stress releasing passage 15 may serve as the stress releasing layer. The stress releasing layer may comprise one of air, polymer, rubber and plastic, or combinations thereof which cover at least a part of the stress releasing passage 15. Preferably, in the stress releasing layer, there may exist a dielectric material layer 11 which covers at least a part of the stress releasing passage 15.

The conductive material layer comprises an internal conductive via 22 and an external stop layer 20. The external stop layer 20 may comprise a material selected from a group consisting of Ru, Ta, TaN, Ti, TiN, TaSiN, TiSiN, TiW and WN, or combinations thereof.

Preferably, the 3D integrated circuit structure may further comprise a stress passage isolating layer 19 which is formed between the through hole 17 and the stress releasing layer. Preferably, an insulating layer 18 is formed on sidewalls of the through hole 17. The insulating layer 18 isolates the through hole 17 from the conductive material layer. The insulating layer 18 may enhance the isolation between the conductive material layer and other structures on the chip.

FIG. 8 shows a schematic view of the connection between the chip 3 in the 3D integrated circuit structure and an external power supply 300, wherein the conductive via 22 exposed from the chip 3 is connected with the external power supply 300, thereby supplying the 3D integrated circuit with power.

FIG. 9 not only illustrates the schematic view of the connection between the chip 3 in the 3D integrated circuit structure and the external power supply 300, but also shows a schematic view of a connection between the chip 3 and a chip 4 in the 3D integrated circuit structure. Referring to FIG. 9, a via 42 is formed on the chip 4 and is in connection with a BEOL 43 of a semiconductor device 45 formed on the chip 4. The methods for forming the semiconductor device 45, the BEOL 43 and the via 42 of the chip 4 are the same as those of the chip 3. Namely, the semiconductor device 45 is formed in a dielectric layer 46 on a silicon layer 44, and the via 42 is formed in a dielectric layer 48 on the dielectric layer 46.

In this way, the chip 3 is in connection with the via 42 by the interconnecting structure (namely, the via 24 and the metal interconnecting wire 28) of the chip 3, thereby connecting the TSV of the chip 3 to the chip 4. Namely, the chip 3 is connected with the chip 4 by connecting the bottom of the chip 3 to the top of the chip 4. Accordingly, a 3D integrated circuit in a stack structure of multiple chips may be achieved.

In the embodiments of the present invention, as for the semiconductor device formed on the silicon substrate, by forming a stress releasing layer to partially release the stress caused by the conductive material in the via, the stress caused by mismatch of CTE between the conductive material and the semiconductor (for example, silicon) surrounding it can be reduced, thereby enhancing the performance of the semiconductor device and the corresponding 3D integrated circuit consisting of the semiconductor devices.

Although the present invention has been disclosed as above with reference to preferred embodiments thereof, it is not limited thereto. Those skilled in the art can modify and vary the embodiments without departing from the spirit and scope of the present invention. Accordingly, any change, modification, replacement and variation of the embodiments shall fall within the scope of the appended claims.

What is claimed is:

1. A 3D integrated circuit structure comprising a first chip, wherein the first chip comprises:
   a first substrate;
   a first semiconductor device formed on the first substrate and a first dielectric layer formed on both the first substrate and the first semiconductor device;
   a through hole, a stress passage isolation layer and a stress releasing layer which penetrate both the first substrate and the first dielectric layer, wherein the stress passage isolation layer surrounds the outside of the through hole and the stress releasing layer surrounds the outside of the stress passage isolation layer;
   an insulating layer formed on inside walls of the stress passage isolation layer;
   a conductive material layer formed within free space of the through hole, wherein the conductive material layer comprises an internal conductive via and an external stop layer; and
   a first interconnecting structure connecting the conductive material layer with the first semiconductor device.

2. The 3D integrated circuit structure according to claim 1, wherein the stress releasing layer comprises a stress releasing passage.

3. The 3D integrated circuit structure according to claim 2, wherein the stress releasing layer comprises a material selected from a group consisting of air, polymer, rubber and plastic or combinations thereof, which covers at least a part of the stress releasing passage.

4. The 3D integrated circuit structure according to claim 3, wherein the stress releasing layer comprises a dielectric material layer which covers at least a part of the stress releasing passage.

5. The 3D integrated circuit structure according to claim 2, wherein the stress releasing layer comprises a dielectric material layer which covers at least a part of the stress releasing passage.

6. The 3D integrated circuit structure according to claim 1, wherein the external stop layer comprises a material selected from a group consisting of Ru, Ta, TaN, Ti, TiN, TaSiN, TiSiN, TiW and WN, or combinations thereof.

7. The 3D integrated circuit structure according to claim 1, further comprising a second chip, wherein the second chip comprises:
   a second substrate;
   a second semiconductor device formed on the substrate, and a second dielectric layer formed on both the second substrate and the second semiconductor device; and
   a second interconnecting structure formed in the second dielectric layer and in connection with the second semiconductor device,
   wherein the first interconnecting structure of the first chip is connected to the second interconnecting structure of the second chip.

8. A method for manufacturing a 3D integrated circuit structure, comprising:
   A. providing a first chip, wherein the first chip comprises a first substrate, a first semiconductor device and a first dielectric layer, and wherein the first semiconductor device is formed on the first substrate, and the first dielectric layer is formed on both the first substrate and the first semiconductor device;
   B. forming a through hole, a stress passage isolation layer and a stress releasing layer which penetrate both the first substrate and the first dielectric layer, wherein the stress passage isolation layer surrounds the outside of the through hole and the stress releasing layer surrounds the outside of the stress passage isolation layer;
   B'. forming an insulating layer on inside walls of the stress passage isolation layer;
   C. filling the through hole to form a conductive material layer; and
   D. forming a first interconnecting structure for connecting the first semiconductor device with the conductive material layer,
   wherein the step B comprises:
      forming a photoresist pattern according to the patterns of the through hole and the stress releasing layer which are to be formed; and
      etching the first substrate and the first dielectric layer according to the photoresist pattern to form the through hole and a stress releasing passage,
      wherein the stress releasing layer is formed from the stress releasing passage, and the stress passage isolating layer is formed between the through hole and the stress releasing layer, wherein the step D comprises:
- forming an external stop layer on internal sidewalls of the through hole; and
- forming an internal conductive via in the external stop layer.

9. The method for manufacturing a 3D integrated circuit structure according to claim 8, further comprising a step between the step B and the step C: filling the stress releasing passage with a material selected from a group consisting of air, polymer, rubber and plastic, or combinations thereof.

10. The method for manufacturing a 3D integrated circuit structure according to claim 9, further comprising a step between step B and step C: filling at least an upper part of the stress releasing passage with a dielectric material.

11. The method for manufacturing a 3D integrated circuit structure according to claim 8, further comprising a step between step B and step C: filling at least an upper part of the stress releasing passage with a dielectric material.

12. The method for manufacturing a 3D integrated circuit structure according to claim 8, wherein the external stop layer comprises a material selected from a group consisting of Ru, Ta, TaN, Ti, TiN, TaSiN, TiSiN, TiW and WN, or combinations thereof.

13. The method for manufacturing a 3D integrated circuit structure according to according to claim 8, characterized by further comprising:
- providing a second chip, wherein the second chip comprises: a second substrate, a second semiconductor device, a second dielectric layer and a second interconnecting structure, wherein the second semiconductor device is formed on the second substrate, the second dielectric layer is formed on both the second substrate and the second semiconductor device, and the second interconnecting structure is formed in the second dielectric layer and in connection with the second device; and
- connecting the first interconnecting structure of the first chip to the second interconnecting structure of the second chip.

* * * * *